(12) United States Patent
Behammer

(10) Patent No.: US 6,790,717 B2
(45) Date of Patent: Sep. 14, 2004

(54) METHOD FOR PRODUCING A SEMICONDUCTOR COMPONENT COMPRISING A T-SHAPED CONTACT ELECTRODE

(75) Inventor: Dag Behammer, Ulm (DE)

(73) Assignee: United Monolithic Semiconductors GmbH, Ulm (DE)

( * ) Notice: Subject to any disclaimer, the term of this patent is extended or adjusted under 35 U.S.C. 154(b) by 0 days.

(21) Appl. No.: 10/466,530

(22) PCT Filed: Jan. 14, 2002

(86) PCT No.: PCT/EP02/00264

§ 371 (c)(1),
(2), (4) Date: Jul. 17, 2003

(87) PCT Pub. No.: WO02/063671

PCT Pub. Date: Aug. 15, 2002

(65) Prior Publication Data

US 2004/0063303 A1 Apr. 1, 2004

(30) Foreign Application Priority Data

Jan. 17, 2001 (DE) .......................................... 101 01 825

(51) Int. Cl.⁷ ............................................ H01L 21/338
(52) U.S. Cl. ........................ 438/182; 438/254; 438/397; 257/309; 257/332
(58) Field of Search ................................ 257/309, 332; 438/158, 182, 254, 334, 397

(56) References Cited

U.S. PATENT DOCUMENTS 4,889,827 A * 12/1989 Willer .......................... 438/180
5,053,348 A * 10/1991 Mishra et al. ............... 438/571
5,155,053 A * 10/1992 Atkinson ..................... 438/577
5,391,510 A  2/1995 Hsu et al.
5,399,896 A  3/1995 Oku
6,171,937 B1 * 1/2001 Lustig ......................... 438/585

FOREIGN PATENT DOCUMENTS

| DE | 39 11 512 | 3/1990 |
| DE | 195 48 058 | 6/1997 |
| EP | 0 177 129 | 4/1986 |
| EP | 0 240 683 | 10/1987 |
| EP | 0591608 | 4/1994 |

OTHER PUBLICATIONS

Patent Abstracts of Japan vol. 016, No. 521 (E–1285) Oct. 27, 1992–& JP 04 196135 A(Sumitomo Electric Ind LTD), Jul. 15, 1992. (Intl srch rep.).

Patent Abstracts of Japan vol. 014, No. 502 (E–0997), Nov. 2, 1990 & JP 02 208945 A (NEC CORP), Aug. 20, 1990 (Intl srch rep.).

"High Performance Gaas Fet Device structure" IBM Technical Disclosure Bulleting, IBM CORP. New York US, VO. 31, No. 5, Oct. 1, 1988, pp. 200–203 XP 000024707 ISSN: 0018–8689, the whole document (Intl srch rep.).

* cited by examiner

*Primary Examiner*—Calvin Lee
(74) *Attorney, Agent, or Firm*—Collard & Roe, P.C.

(57) ABSTRACT

In order to fabricate a semiconductor component having a contact electrode that is T-shaped in cross section, in particular a field-effect transistor with a T gate, a method is described in which a self-aligning positioning of gate base and gate head is effected by means of a spacer produced on a material edge.

9 Claims, 2 Drawing Sheets

Figure 1A:
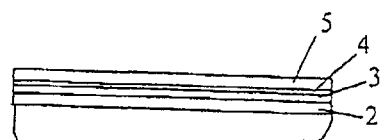

METHOD FOR PRODUCING A SEMICONDUCTOR COMPONENT COMPRISING A T-SHAPED CONTACT ELECTRODE

CROSS REFERENCE TO RELATED APPLICATIONS

Applicants claim priority under 35 U.S.C. §119 of GERMAN Application No. 101 01 825.8 filed on 17 Jan. 2001. Applicants also claim priority under 35 U.S.C. §365 of PCT/EP02/00264 filed on Jan. 14, 2002. The international application under PCT article 21(2) was not published in English.

DESCRIPTION

The invention relates to a method for fabricating a semiconductor component having a metallic contact electrode that is T-shaped in cross section, in particular a field-effect transistor with a T-shaped metal gate.

In field-effect transistors, the gate length is a dimension that critically determines the limiting frequency of the transistor, so that the shortest possible gate length is sought for high frequencies. On the other hand, the lead resistance of the gate electrode is also intended to be as low as possible. The features of short gate length and low lead resistance can be realized in particular by means of metallic gate electrodes with a narrow gate base and a wide gate head by comparison therewith, so-called T-shaped electrodes (T gate).

Very small gate lengths in the submicron range, in particular less than 0.2 µm, can currently be fabricated only with limited reliability using direct optical lithography.

DE 39 11 512 A1 discloses a self-aligning method for fabricating a control electrode in which openings for structures of source and drain electrodes are produced photolithographically in a resist layer. By means of undercutting, the region between the source and drain structures is intended to be reduced to a narrow dummy gate which, in a later method stage, surrounded by a new resist layer, centers the etching of a gate head structure and is removed before the deposition of the gate metal. However, in reality the undercutting leads to a dummy gate form having a widened base. The undercutting is not reproducible with sufficient precision. In addition, the distance between the openings for the structures of source and drain electrodes cannot be set sufficiently accurately as an initial basis for the width of the dummy gate during the direct optical lithography.

The technique of defining a lateral structure in the submicron range by means of a layer, deposited on a vertical step sidewall, as auxiliary layer having a thickness that can be set accurately has long been known per se. By way of example, IEEE Electron Device Letters, EDL-2, No 1, January 1981, pp. 4–6 by Hunter et al., A New Edge-Defined Approach for Submicrometer MOSFET Fabrication, describes a method in which two elements with lateral submicron dimensions produced with respect to the sidewalls of a step structure serve, after the removal of the step structure, as masks for producing very narrow gate structures in underlying layers. Such elements produced on vertical sidewalls are also referred to as side spacers or hereinafter also simply as spacers.

DE 195 48 058 C2 describes a method for fabricating a MOS transistor in which spacers are produced on spaced-apart sidewalls of a structure produced photolithographically, which spacers serve as a mask for a subsequent etching of an underlying conductive first electrode layer, so that material webs remain as gate base below the spacers. A second electrode layer deposited thereabove over the whole area is patterned photolithographically in order to produce a gate head.

In EP 0 240 683, the gate length of a GaAs JFET is defined by an SiN spacer on a vertical edge of a photoresist structure. After a planarization of the SiN spacer, the latter masks the etching of the highly doped cap layer and thus defines the gate of the JFET.

A corresponding procedure is disclosed in U.S. Pat. No. 5,202,272 for fabricating a FET using silicon technology.

JP 04-196 135 A shows a method for fabricating a T gate with a short gate ength by producing an $SiO_2$ spacer on a vertical edge of a photoresist mask deposited above a semiconductor substrate, which spacer serves as a dummy for the gate base in a ate base layer and is removed again. In a head layer deposited thereabove, an opening as structure for the gate head is produced using a separate mask. In a uniform deposition step, the gate metal for forming the T-shaped gate is deposited into the gap of the dummy gate and the opening in the head layer. In an intermediate step, the spacer on the vertical edge of the photoresist mask may also serve for the self-aligning production of a low-impedance source region.

In a method disclosed in JP 02-208 945, a spacer is likewise produced on a vertical edge a a dummy gate and is subsequently removed with additional etching of a recess trench before a further photoresist layer is deposited and, in the latter, an opening for the structure of the gate head is produced above the gap of the dummy gate by means of a separate mask. Gate metal for forming a T-shaped gate is deposited into the opening of the further photoresist layer and into the gap of the dummy gate and excess metal on the further photoresist layer is removed by lift-off.

U.S. Pat. No. 5,391,510 describes a method in which a dummy gate is produced by means of a spacer on a vertical layer edge, which dummy gate is surrounded by an insulator layer and is removed to leave a gap which forms the structure for the gate base. The T-shaped gate is completed by whole-area deposition of a gate metal layer and subsequent etching.

EP 0 177 129 discloses a method in which the gate is defined directly by a metallic spacer, but without the possibility of producing a wider gate head.

EP 0 591 608 A2 describes a first fabrication method, which combines optical lithography for the gate head and electron beam lithography for the gate base by means of two different photoresist layers deposited one above the other. However, electron beam lithography is an expensive and time-consuming step in production with an unsatisfactory yield.

Therefore, the same document proposes a new method, in which an insulator layer is deposited onto the semiconductor material and a vertical step is produced in said insulator layer by means of optical lithography. A metal layer deposited over the area is also deposited on the vertical step sidewall. After planarization and production of a gate head mask above the vertical step, it is possible to remove the metal layer on the step sidewall. The resulting gap serves as a mask for the etching of a recess trench and for the deposition of the gate base metal. The layer thickness of the metal layer deposited on the step sidewall can be set very accurately according to known methods, so that a very short gate length can be realized in a reliable manner. However, the risk of misalignment between gate base and gate head arises as a result of the separate lithography steps for the vertical step, on the one hand, and the gate head mask.

The known method comprises further disadvantageous steps, in particular, in the advanced stage of fabrication, etching processes with an open recess trench and/or partly uncovered semiconductor contact layers, which can adversely affect the properties of the component.

In a method disclosed in U.S. Pat. No. 5,399,896, firstly a recess trench is defined with a first spacer (outside spacer) on a step sidewall and by means of an Al implantation and, on the resulting sidewalls of the recess trench, further spacer layers (inside spacer) are produced in a manner facing one another, whose lateral spacing determines the gate length and is filled with gate metal. The gate length actually produced depends on the lateral dimensions of the first and of the further spacers, which are in turn influenced by the heights of the respective vertical steps. Poor reproducibility of the gate length is expected due to the multiplicity of parameters influencing the gate length. What is disadvantageous about the method, moreover, is that the recess bottom can be damaged during the second spacer etching, which can lead to an impairment of the component properties.

The invention is based on the object of specifying an advantageous method for fabricating a T-shaped electrode with a very narrow electrode base.

The invention is described in patent claim 1. The dependent claims contain advantageous refinements and developments of the invention. The invention is described below on the basis of the preferred use for the fabrication of a gate electrode of a field-effect transistor as electrode of a semiconductor component, but without being restricted thereto.

The invention makes use of the technique—known per se and described extensively in the introduction—for producing very fine lateral structures by means of an auxiliary layer deposited on a vertical material edge as a spacer, whose layer thickness determines the width of the gate base, but, furthermore, also uses said spacer as a positioning mask for the gate head, which is significantly wider than the gate base. On the one hand, it is thus possible to use exclusively optical lithography, and, on the other hand, the self-alignment of gate head and gate base precludes alignment errors as in a plurality of lithography steps. The gate length is essentially defined by the thickness of the auxiliary layer of the spacer, the steepness of the material edge and the anisotropy and homogeneity of the spacer etching. However, these quantities can be set and controlled sufficiently precisely by means of known methods, and in particular when using dry-chemical processes.

Preferably, the spacer is produced up to a height above the semiconductor material which lies above the height of the gate head to be fabricated. In particular, provision may be made for producing a material layer—referred to hereinafter as head layer—on both sides around the spacer, a structure for the fabrication of the gate head subsequently being produced in said layer. The tip of the spacer preferably projects above said head layer. The head layer may be composed of a photoresist, for example, and is preferably planarized.

Further layers may be deposited above the spacer, in particular above the head layer with the spacer tip projecting thereabove. In particular, a contour layer following the contour of the spacer and the spacer tip may be provided, which projects through a covering layer deposited above it in the region of the spacer. By means of defined etching of the contour layer with undercutting of the covering layer, it is possible, in the contour layer, for an opening which is centered with respect to the spacer and extended with respect thereto to be produced as a mask for the wider gate head structure. In the head layer, a profile tapering toward the gate base is advantageously produced for the gate head, which profile leads to a laterally upwardly curved underside of the gate head with low capacitance with respect to source and drain and, in particular, to a spur-free head profile. Preferably, gate base and gate head are produced in a single process step, in particular by vapor deposition of gate electrode metal.

In an advantageous manner, before the production of the spacer, the semiconductor material is coated with a protective layer, for example a nitride layer, in which an opening to the semiconductor material is produced after the resolution of the spacer and which is removed only after the deposition of the gate electrode metal. This protective layer protects the semiconductor surface from damage in the course of the fabrication of the gate electrode, in particular during the various etching processes. A recess surrounding the gate base in the semiconductor material is preferably produced in a last etching step before the deposition of the gate electrode metal, so that the particularly critical semiconductor surface of the recess bottom is not exposed to possibly damaging influences of other process steps. These protective measures are also advantageous with a different procedure for fabricating a gate electrode.

The invention is also illustrated thoroughly below using a preferred exemplary embodiment with reference to the illustrations of FIG. 1a to FIG. 1r, which show a particularly advantageous process sequence for fabricating a PHEMT in a compound semiconductor material.

Figure 1B:
Figure 1C:
Figure 1D:
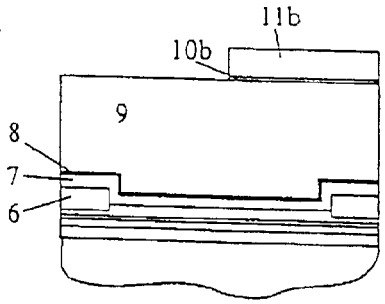
Figure 1E:
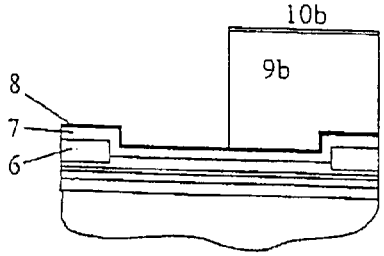
Figure 1F:
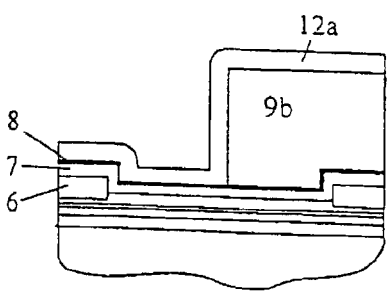
Figure 1G:
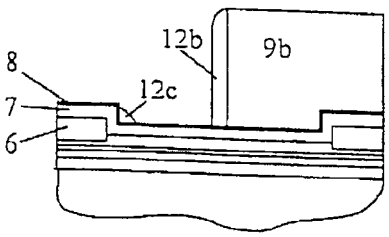
Figure 1H:
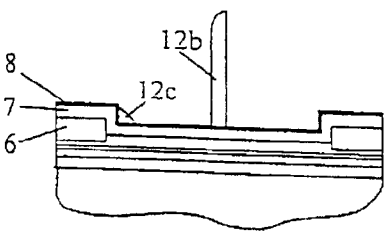
Figure 1I:
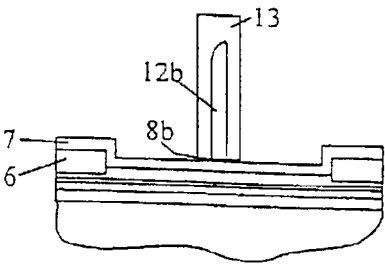
Figure 1J:
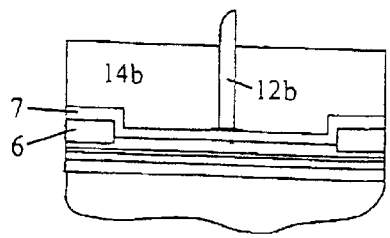
Figure 1K:
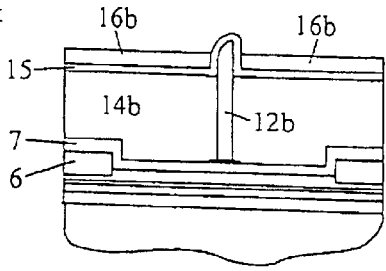
Figure 1L:
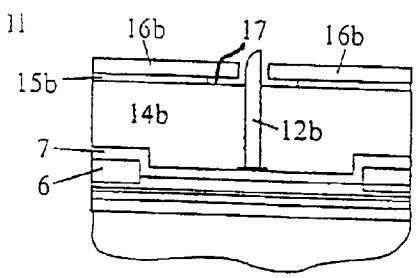
Figure 1M:
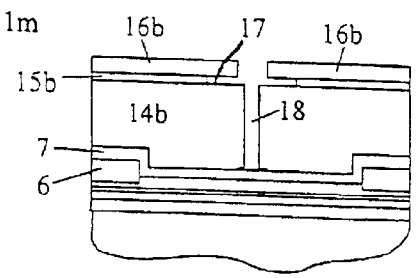
Figure 1N:
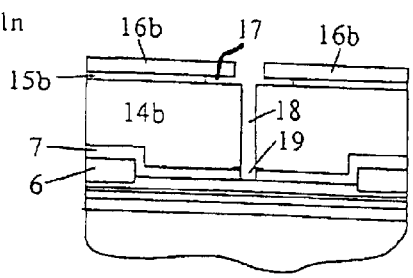
Figure 1O:
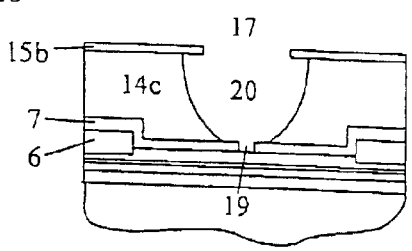
Figure 1P:
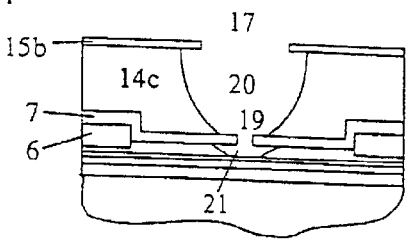
Figure 1Q:
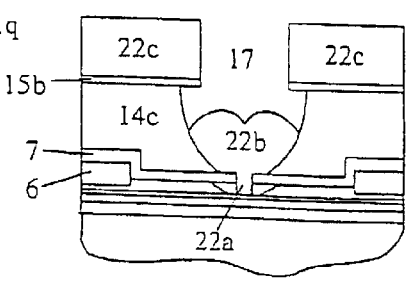
Figure 1R:
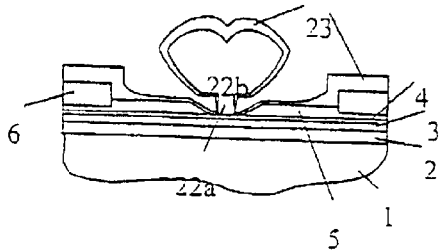

The invention is explained in more detail below using an exemplary embodiment with reference to diagrammatic drawings in the figures, in which FIGS. 1a–1r show process steps for fabricating a PHEMT with a self-aligned T gate.

Proceeding from the GaAs substrate 1, the epitaxially produced layers 2–5 define the vertical profile of the transistor, which is coordinated with the respective application in the individual case in terms of its thickness and element structure. Typically, 2 represents the buffer, 3 forms the two-dimensional electron gas (the channel), 4 is a stop layer which contributes to the defined etching of the recess trench, and 5 is the highly doped contact layer (FIG. 1a). After the definition of the ohmic contacts 6 for source and drain in FIG. 1b, a nitride ($Si_3N_4$) layer 7 is deposited by PECVD as protective layer and a metallic stop layer 8 is applied (see FIG. 1c). Afterward, the thermostable resist layer 9 (e.g. PMGI, PMMA or polyimide) and the inorganic layer 10 are applied, into which the structure 10b is transferred through the photoresist mask 11b by means of reactive ion etching (RIE). The mask 10b then masks a dry-chemical plasma etching of the thermostable resist layer 9 and thus defines the structure 9b, with the material step, which is distinguished by a high sidewall steepness and has no resist base at the transition to the stop layer 8 (see FIGS. 1d and e). Both properties can be produced by setting the parameters of the RIE etching used, in a manner known per se. After the removal of the mask 10b, the oxide layer 12a is deposited by PECVD, which oxide layer forms a spacer 12b on the resist edge as a result of the subsequent anisotropic etching. Depending on the topography of the ohmic contacts 6, it is possible for further parasitic spacers 12c to arise (FIGS. 1f and g). After the removal of the thermostable resist layer 9, depending on the chemical composition e.g. in the oxygen plasma or in a wet-chemical manner (FIG. 1h), the regions 13 in which the oxide spacer 12b is to be preserved are protected by means of a photo-step. The feature size and the alignment 13 with respect to 12b are very noncritical. The parasitic oxide spacers 12c and also the stop layer 8 not covered by 13 are removed (FIG. 1i).

A further resist layer 14 planarizes the surface in such a way that, after a homogeneous dry-chemical resist thinning process, the etched-back resist layer 14b uncovers the upper part of the spacer 14b (FIG. 1j). This process step is repeated with a thinner resist as covering layer 16 after the deposition of an inorganic layer 15, which follows the contour of the spacer 14b, so that the contour layer 15 is visible above the covering layer only at the spacer 14b (FIG. 1k). Prior to the thinning process, a structure (not depicted) for a gate contact region may additionally be exposed in 16. The inorganic layer 15 is etched in a manner masked by the etched-back photoresist 16b and selectively with respect to the oxide layer 12. In this case, the selectivity with respect to the photoresist is chosen to be sufficiently high and the dry-chemical etching has a high isotropic proportion. A defined undercutting can be achieved as a result. The resulting structure 15b of the contour layer, together with the opening 17, determines the size of the gate head (FIG. 1k). Wet-chemical removal of the oxide spacer 12b and the stop layer 8 produces the hole 18, which, together with 16b, masks the subsequent plasma etching of the protective layer 7 (FIGS. 1m and n). The resulting hole 19 in the protective layer 7 subsequently masks the wet-chemical etching of the recess.

A further dry-chemical etching of the head layer with the opening 17 in the contour layer 15b as mask 14b produces a well profile 20, which, on the one hand has a significant undercut with respect to 15b and, on the other hand, still covers large parts of te bottom above the protective layer 7 (FIG. 1o). This form makes it possible to ensure a subsequent gate lift-off is good and the otherwise typical run-out profile of the lower area of the gate head is avoided during the vapor deposition. The etching of the recess trench 21 (FIG. 1p) is followed by the gate vapor deposition 22a, 22b, 22c (FIG. 1q).

In this case, 22a represents the gate base and 22b represents the gate head. In the subsequent lift-off process, the photoresist 14c is removed wet-chemically and lifts off the layers 15b and 22c in the process. After the removal of the nitride protective layer 7, the transistor is passivated with a passivation layer 23, e.g. an $Si_3N_4$ layer, and contact-connected with passive components by means of further steps in a customary manner.

The invention is particularly advantageous for field-effect transistors in compound semiconductor materials in particular in pseudomorphic or metamorphic III–V HEMT technology, where the gate length and the width of the recess trench are geometrically particularly critical lateral quantities of less than 0.2 µm, whereas the remaining lateral dimensions are significantly larger and less critical.

The features which are specified above and those specified in the claims and also those which can be gathered from the drawings can be realized advantageously both individually and in different combinations. The invention is not restricted to the exemplary embodiments described, but rather can be modified in various ways within the scope of expert ability.

What is claimed is:

1. A method for fabricating a semiconductor component having a metallic contact electrode that is T-shaped in cross section comprising the steps of:
    (a) depositing an auxiliary layer as a spacer on a material edge of a semiconductor material for determining position and width of an electrode base;
    (b) depositing a head layer around the spacer so that a tip of the spacer projects above the head layer;
    (c) using the spacer as a positioning marker for a wider electrode head; and
    (d) producing a structure in the head layer for fabricating the electrode head.

2. The method according to claim 1 wherein the semiconductor component is a field-effect transistor with a T gate.

3. The method according to claim 1, wherein, before the production of the spacer, a protective layer is deposited on the semiconductor material.

4. The method according to claim 1, wherein a contour layer is deposited on the head layer and the spacer tip and a covering layer is deposited on said contour layer and the contour layer is uncovered above the spacer layer by partial removal of the covering layer.

5. The method according to claim 4, wherein, by undercutting under the covering layer, in the contour layer, an extended opening is uncovered around the spacer as mask for the fabrication of the electrode head.

6. The method according to claim 1, wherein a profile tapering downward to the electrode base is uncovered in the head layer.

7. The method according to claim 1, wherein, after the removal of the spacer, a recess trench is etched into the semiconductor material.

8. The method according to claim 7, wherein the etching of the recess trench is performed as a last etching step before the deposition of the electrode base metal (22a).

9. The method according to claim 1, wherein the electrode base and the electrode head are fabricated in one method step by vapor deposition of an electrode metal.

* * * * *